United States Patent
Hwang et al.

(10) Patent No.: US 9,660,048 B2
(45) Date of Patent: May 23, 2017

(54) HIGH ELECTRON MOBILITY TRANSISTORS EXHIBITING DUAL DEPLETION AND METHODS OF MANUFACTURING THE SAME

(75) Inventors: In-jun Hwang, Hwaseong-si (KR);
Jong-seob Kim, Hwaseong-si (KR);
Hyuk-soon Choi, Hwaseong-si (KR);
Ki-ha Hong, Cheonan-si (KR);
Jai-kwang Shin, Anyang-si (KR);
Jae-joon Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 63 days.

(21) Appl. No.: 12/929,492

(22) Filed: Jan. 28, 2011

(65) Prior Publication Data
US 2011/0215378 A1 Sep. 8, 2011

(30) Foreign Application Priority Data
Mar. 2, 2010 (KR) .................. 10-2010-0018631

(51) Int. Cl.
*H01L 29/66* (2006.01)
*H01L 29/778* (2006.01)
(Continued)

(52) U.S. Cl.
CPC .... *H01L 29/66462* (2013.01); *H01L 29/7783* (2013.01); *H01L 29/7786* (2013.01);
(Continued)

(58) Field of Classification Search
CPC .................. H01L 29/0657; H01L 29/2003
(Continued)

(56) References Cited

U.S. PATENT DOCUMENTS 5,445,979 A * 8/1995 Hirano .............. H01L 29/66462
148/DIG. 100
5,471,073 A * 11/1995 Kohno ................ H01L 29/0843
257/108
(Continued)

FOREIGN PATENT DOCUMENTS

CN 1551373 A 12/2004
CN 1722465 A 1/2006
(Continued)

OTHER PUBLICATIONS

European Search Report dated Mar. 25, 2013 corresponding to Application No. 11156472.0-1552.
(Continued)

*Primary Examiner* — Jay C Kim
(74) *Attorney, Agent, or Firm* — Harness, Dickey & Pierce, P.L.C.

(57) ABSTRACT

High electron mobility transistors (HEMT) exhibiting dual depletion and methods of manufacturing the same. The HEMT includes a source electrode, a gate electrode and a drain electrode disposed on a plurality of semiconductor layers having different polarities. A dual depletion region exists between the source electrode and the drain electrode. The plurality of semiconductor layers includes an upper material layer, an intermediate material layer and a lower material layer, and a polarity of the intermediate material layer is different from polarities of the upper material layer and the lower material layer.

3 Claims, 11 Drawing Sheets

(51) Int. Cl.
  *H01L 29/06* (2006.01)
  *H01L 29/20* (2006.01)
  *H01L 29/417* (2006.01)
  *H01L 29/423* (2006.01)

(52) U.S. Cl.
  CPC ...... *H01L 29/0657* (2013.01); *H01L 29/2003* (2013.01); *H01L 29/41766* (2013.01); *H01L 29/42316* (2013.01)

(58) Field of Classification Search
  USPC .......... 257/12, 192, 194, E29.246, E29.248, 257/E29.252
  See application file for complete search history.

(56) References Cited

U.S. PATENT DOCUMENTS

| | | | | |
|---|---|---|---|---|
| 5,929,467 A * | 7/1999 | Kawai | ............... | H01L 21/28194 257/192 |
| 5,990,531 A * | 11/1999 | Taskar | ............... | H01L 21/28587 257/410 |
| 6,177,685 B1 * | 1/2001 | Teraguchi | ............... | H01L 29/201 257/192 |
| 6,297,538 B1 * | 10/2001 | Kolodzey | ......... | H01L 21/28202 257/289 |
| 6,521,998 B1 * | 2/2003 | Teraguchi | ......... | H01L 21/28581 257/104 |
| 6,548,333 B2 * | 4/2003 | Smith | ................. | H01L 29/7783 257/194 |
| 6,560,452 B1 * | 5/2003 | Shealy | ................. | H03B 5/1228 331/117 R |
| 6,888,739 B2 * | 5/2005 | Forbes | ................... | B82Y 10/00 257/300 |
| 6,897,495 B2 * | 5/2005 | Yoshida | ............ | H01L 21/28575 257/103 |
| 7,026,665 B1 * | 4/2006 | Smart | ................. | H01L 29/7787 257/189 |
| 7,071,526 B2 * | 7/2006 | Ando | .................... | H01L 29/475 257/473 |
| 7,084,441 B2 * | 8/2006 | Saxler | ................. | H01L 29/0649 257/194 |
| 7,268,375 B2 * | 9/2007 | Shur | ................... | H01L 29/7783 257/194 |
| 7,271,429 B2 * | 9/2007 | Saito et al. | ................ | 257/197 |
| 7,304,330 B2 * | 12/2007 | Nakagawa | ......... | H01L 29/7787 257/192 |
| 7,304,331 B2 * | 12/2007 | Saito et al. | ................ | 257/192 |
| 7,394,112 B2 | 7/2008 | Kohn et al. | | |
| 7,432,142 B2 * | 10/2008 | Saxler | ................. | H01L 29/7787 257/E21.406 |
| 7,432,565 B2 * | 10/2008 | Passlack | ........... | H01L 29/41775 257/192 |
| 7,456,443 B2 * | 11/2008 | Saxler | .................... | H01L 21/318 257/194 |
| 7,508,014 B2 * | 3/2009 | Tanimoto | ...................... | 257/192 |
| 7,521,707 B2 * | 4/2009 | Kawasaki et al. | .............. | 257/20 |
| 7,550,784 B2 * | 6/2009 | Saxler | ................. | H01L 29/7787 257/12 |
| 7,560,752 B2 * | 7/2009 | Akamatsu | ............ | H01L 29/0657 257/187 |
| 7,615,774 B2 * | 11/2009 | Saxler | ................. | H01L 29/7783 257/194 |
| 7,671,684 B2 * | 3/2010 | Honda | .................... | H03F 1/301 330/277 |
| 7,728,355 B2 * | 6/2010 | Beach | ................. | H01L 29/7787 257/192 |
| 7,732,847 B2 * | 6/2010 | Tanaka | .............. | H01L 21/28291 257/295 |
| 7,737,467 B2 * | 6/2010 | Saito | ..................... | H01L 29/402 257/192 |
| 7,800,130 B2 * | 9/2010 | Sugimoto | ......... | H01L 29/42316 257/192 |
| 7,884,394 B2 * | 2/2011 | Wu | ....................... | H01L 23/492 257/194 |
| 7,939,853 B2 * | 5/2011 | Murphy | .............. | H01L 29/2003 257/188 |
| 7,948,011 B2 * | 5/2011 | Rajan et al. | ................... | 257/194 |
| 7,965,126 B2 * | 6/2011 | Honea | ............. | H03K 17/08142 327/110 |
| 7,973,304 B2 * | 7/2011 | Beach | ................. | H01L 29/2003 257/192 |
| 7,973,877 B2 * | 7/2011 | Takeda | .............. | G02F 1/133603 315/193 |
| 8,149,027 B2 * | 4/2012 | Cygan | ................... | H03F 3/2173 327/110 |
| 8,154,079 B2 * | 4/2012 | Matsushita | .......... | H01L 27/0251 257/340 |
| 8,248,042 B2 * | 8/2012 | Morita | ................ | H01L 27/0617 323/222 |
| 8,299,737 B2 * | 10/2012 | Morita et al. | ............ | 318/400.27 |
| 8,385,099 B2 * | 2/2013 | Kaneko | .................... | G11C 11/22 365/109 |
| 8,426,892 B2 * | 4/2013 | Imanishi | ........... | H01L 21/02378 257/192 |
| 8,507,949 B2 * | 8/2013 | Nishimori | ........... | H01L 29/0657 257/183 |
| 8,624,662 B2 * | 1/2014 | Parikh | ................. | H01L 21/8258 327/390 |
| 8,921,903 B2 * | 12/2014 | Masuda | ................ | H01L 21/048 257/256 |
| 2001/0015446 A1 | 8/2001 | Inoue et al. | | |
| 2002/0017696 A1 * | 2/2002 | Nakayama | ........ | H01L 21/28587 257/471 |
| 2005/0001235 A1 | 1/2005 | Murata et al. | | |
| 2008/0143421 A1 * | 6/2008 | Yanagihara et al. | .......... | 327/427 |
| 2011/0012173 A1 * | 1/2011 | Umeda | ............. | H01L 29/41766 257/192 |
| 2011/0227093 A1 * | 9/2011 | Hikita | .................... | H01L 29/808 257/76 |

FOREIGN PATENT DOCUMENTS

| | | | | |
|---|---|---|---|---|
| EP | 1501134 A1 | 1/2005 | | |
| JP | 05251475 A | 9/1993 | | |
| JP | 2003535481 A | 11/2003 | | |
| JP | WO 2007/004673 | * 1/2007 | ............... | H03F 1/30 |
| JP | 2007027284 A | 2/2007 | | |
| JP | 2007-134608 | 5/2007 | | |
| JP | 2008135575 A | 6/2008 | | |
| JP | WO 2008/069074 | * 6/2008 | ........... | H01L 21/338 |
| JP | 2008-165888 | 7/2008 | | |
| JP | 2009032873 A | 2/2009 | | |
| KR | 10-0359714 | 3/2001 | | |
| KR | 10-0343814 B1 | 6/2002 | | |
| WO | WO 2010/016564 A1 | 2/2010 | | |

OTHER PUBLICATIONS

Eldad Bahat-Treidel et al., "Punchthrough-Voltage Enhancement of AlGaN/GaN HEMTs Using AlGaN Double-Heterojunction Confinement", IEEE Transactions on Electron Devices Vo. 55, No. 12, Dec. 2008, pp. 3354-3359.
Chinese Office Action for corresponding Chinese Application No. 201110051882.0 dated Jul. 24, 2014.
Dec. 2, 2014 Japanese Office Action issued in corresponding Japanese Application No. 2011-045430 with English Translation.
Jan. 28, 2015 Chinese Office Action issued in corresponding Chinese Application No. 201110051882.0 with English translation.
Chinese Office Action dated Jun. 30, 2015 issued in corresponding Chinese Application No. 201110051882.0 (full English translation provided).
Japanese Office Action dated Sep. 21, 2015 issued in corresponding Japanese Application No. 2011-045430.

* cited by examiner

HIGH ELECTRON MOBILITY TRANSISTORS EXHIBITING DUAL DEPLETION AND METHODS OF MANUFACTURING THE SAME

CROSS-REFERENCE TO RELATED APPLICATIONS

This application claims the benefit of priority of Korean Patent Application No. 10-2010-0018631, filed on Mar. 2, 2010, in the Korean Intellectual Property Office, the disclosure of which is incorporated herein in its entirety by reference.

BACKGROUND

1. Field

Example embodiments relate to power devices, and more particularly, to high electron mobility transistors (HEMTs) and methods of manufacturing the same.

2. Description of the Related Art

A high electron mobility transistor (HEMT) includes semiconductors with different band gaps. In a HEMT, semiconductors with different band gaps are joined together. In a HEMT, a semiconductor with a relatively wide band gap functions as a donor. Such a semiconductor with the relatively wide band gap forms 2-dimensional electron gas (2DEG) in a semiconductor with a relatively narrow band gap. In a HEMT, the 2DEG may be used as a channel. As a result, a channel is spatially apart from a donor in a HEMT, and thus electron carriers may have high mobility. A HEMT has a hetero-junction structure, and thus a HEMT is also known as a hetero-junction field effect transistor (HFET).

A HEMT may not only be used for improving the mobility of electron carriers, but may also be used as a transistor with a substantially high breakdown voltage as a power device. A HEMT includes a semiconductor with a relatively wide band gap, (e.g. a compound semiconductor). Therefore, a breakdown voltage of a HEMT may be high.

2DEG may be formed by n-doping a material having a relatively wide band gap or by using a polarized material.

In a semiconductor device, space charge occurs due to depletion. Thus, an electric field may be concentrated at a gate. Similarly, in a HEMT, the 2DEG between a gate and a drain is removed during a turning-off operation, a space charge remains, and an electric field is concentrated at the gate due to the space charge. Due to the concentration of the electric field at the gate, the breakdown voltage of the HEMT may decrease.

SUMMARY

Example embodiments relate to power devices, and more particularly, to high electron mobility transistors (HEMTs) and methods of manufacturing the same.

Provided are high electron mobility transistors (HEMTs), which are capable of preventing concentrations of an electric field at gates and have more uniform electric field distributions. Provided are methods of manufacturing the HEMTs.

Additional aspects will be set forth in part in the description which follows and, in part, will be apparent from the description, or may be learned by practice of the presented example embodiments.

According to example embodiments, a high electron mobility transistor (HEMT) includes a source electrode, a gate electrode, and a drain electrode on a plurality of semiconductor layers with different polarizabilities (or polarities), wherein a dual depletion region exists between the source electrode and the drain electrode.

A semiconductor layer with a relatively low polarizability (or polarity) from among the plurality of semiconductor layers may include at least one of 2-dimensional electron gas (2DEG) and 2-dimensional hole gas (2DHG).

The plurality of semiconductor layers may include an upper material layer, an intermediate material layer, and a lower material layer, wherein a polarizability (or polarity) of the intermediate material layer may be different from polarizabilities (or polarities) of the upper material layer and the lower material layer.

The lower material layer may include a 2DEG channel, and the upper material layer may include a 2DHG channel.

The upper material layer may include a 2DEG channel, and the lower material layer may include a 2DHG channel.

A 2DEG channel may be formed on a surface of the intermediate material layer contacting the upper material layer, and a 2DHG channel may be formed on a surface of the intermediate material layer contacting the lower material layer.

A 2DEG channel may be formed on a surface of the intermediate material layer contacting the lower material layer, and a 2DHG channel may be formed on a surface of the intermediate material layer contacting the upper material layer.

The intermediate material layer may be a single material layer or a multi material layer.

The plurality of semiconductor layers may include an upper material layer, an intermediate material layer and a lower material layer, and the gate electrode and the drain electrode may be on the upper material layer and disposed apart from each other.

The source electrode may be on the upper material layer.

The source electrode may directly contact a 2DHG channel and contact a side surface of the upper material layer.

An insulation layer may be disposed between the upper material layer and the gate electrode.

According to example embodiments, a HEMT includes an intermediate material layer on a lower material layer, an upper material layer and a drain electrode over the intermediate material layer, a gate electrode on at least one of the intermediate material layer and the upper material layer, and a source electrode on at least one of the intermediate material layer and the upper material layer, wherein a polarizability (or polarity) of the intermediate material layer is different from polarizabilities (or polarities) of the upper material layer and the lower material layer, and a dual depletion region exists between the gate electrode and the drain electrode.

The upper material layer and the drain electrode may contact the intermediate material layer, and the source electrode may be disposed apart from the gate electrode and on the intermediate material layer or the upper material layer.

The gate electrode and the source electrode may be formed on the upper material layer.

The gate electrode and the source electrode may be formed on the intermediate material layer. A side surface of the gate electrode may contact the upper material layer.

The gate electrode may be in ohmic contact with the upper material layer, and the gate electrode and the intermediate material layer may form a Schottky contact.

The gate electrode may include a first gate electrode and a second gate electrode.

The first gate electrode may be in ohmic contact with the upper material layer. The second gate electrode may be in ohmic contact with the first gate electrode and the upper material layer, and may form a Schottky contact with the intermediate material layer.

At least one of the source electrode and the drain electrode may contact a side surface of the lower material layer.

An insulation layer may be disposed between the gate electrode and at least one of intermediate material layer and the upper material layer.

The upper material layer and the drain electrode may be disposed apart from each other on the intermediate material layer.

The source electrode may be disposed on the upper material layer.

The source electrode may directly contact a 2DHG channel and contact a side surface of the upper material layer.

BRIEF DESCRIPTION OF THE DRAWINGS

These and/or other aspects will become apparent and more readily appreciated from the following description of the example embodiments, taken in conjunction with the accompanying drawings of which.

DETAILED DESCRIPTION

Figure 1:
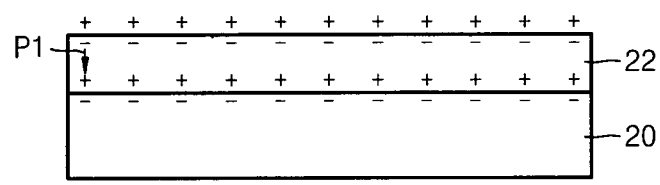
FIGS. 1 through 3 are cross-sectional views for describing the basic mechanism of a high electron mobility transistor (HEMT) according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to power devices, and more particularly, to high electron mobility transistors (HEMTs) and methods of manufacturing the same.

In a high electron mobility transistor (HEMT) according to example embodiments, 2-dimensional electron gas (2DEG) may be formed by using a polarized material. When semiconductors with different polarizabilities (or polarities) are joined together, the 2DEG may be formed in a material (semiconductor) with a relatively narrow band gap to offset a surface charge due to polarization.

Hexagonal Ga(Al, In)N is a material polarized along the c-axis. If the direction of growth is the N-face direction, the polarization is formed in the direction of growth. If the direction of growth is the Ga-face direction, the polarization is formed in the direction opposite to the direction of growth. When the hexagonal Ga(Al, In)N forms a hetero-junction, polarizability (or polarity) may increase due to strains based on a lattice parameter difference.

When using polarization as described above, 2DEG or 2-dimensional hole gas (2DHG) may be formed without doping.

A HEMT according to example embodiments will be described below.

Figure 2:
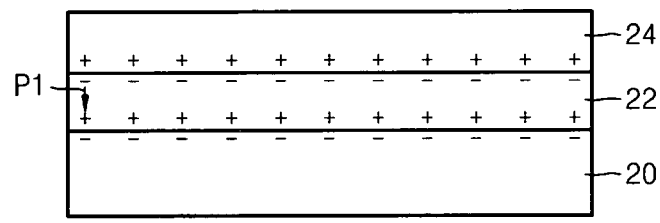
Figure 3:
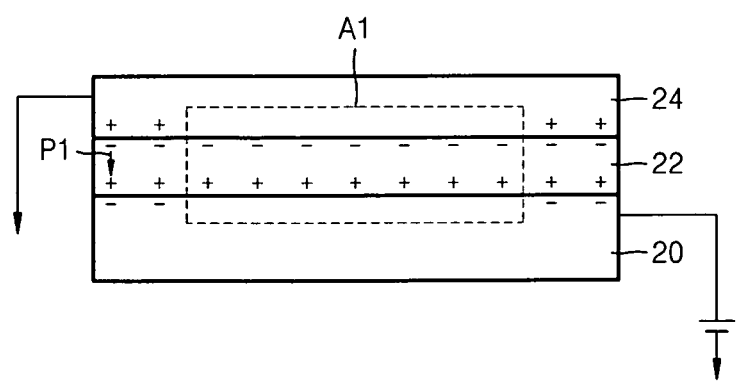

FIGS. 1 through 3 are diagrams for describing the basic mechanism of a HEMT according to example embodiments.

Referring to FIG. 1, first and second material layers 20 and 22 are stacked. The first and second material layers 20 and 22 may be semiconductor layers with different polarizabilities (or polarities). For example, the first material layer 20 may be a GaN layer or an InGaN layer. The second material layer 22 may be a semiconductor layer with greater polarizability (or polarity) as compared to the first material layer 20. For example, the second material layer 22 may be an AlGaN layer. Due to the difference of polarizabilities (or polarities), a polarization P1 exists in the second material layer 22. For convenience of explanation, the polarization P1 is indicated by an arrow at only one location, and the polarization of the first material layer 20 with relatively small polarizability (or polarity) is omitted. Charges + and − in the second material layer 22 are charges due to the polarization P1. Due to the polarization P1 of the second material layer 22, negative charges (−) appear on the surface of the first material layer 20 contacting the second material layer. The negative charges (−) appearing on the surface of the first material layer 20 contacting the second material layer 22 may form a 2DEG. Due to the polarization P1, positive charges (+) appear on an exterior side of the surface of the second material layer 22 opposite to the surface of the second material layer 22 contacting the first material layer 20 (that is, the top surface of the second material layer 22). The positive charges (+) appearing on the exterior side of the top surface of the second material layer 22 are immobile surface charges (referred to hereinafter as positive immobile charges). High breakdown voltage characteristic of a HEMT may be increased by converting the positive immobile charges on the top surface of the second material layer 22 into mobile charges.

To convert positive immobile charges on the top surface of the second material layer 22 into mobile charges, a third material layer 24 is disposed on the second material layer 22 as shown in FIG. 2. The third material layer 24 is a semiconductor layer with a polarizability (or polarity) different from that of the second material layer 22. For example, the third material layer 24 may be a GaN layer or an InGaN layer, with a polarizability (or polarity) smaller than that of the second material layer 22. The third material layer 24 may be formed of the same material as the first material layer 20. However, example embodiments are not limited thereto. The first, second and third material layers 20, 22 and 24 may belong to groups III-V compound semiconductor layers.

Referring to FIG. 2, positive charges (+) appear on the surface of the third material layer 24 contacting the second material layer 22. The positive charges (+) on the surface of the third material layer 24 contacting the second material layer 22 are mobile charges that may be moved like electrons of 2DEG, as a free hole gas. The positive charges (+) on the surface of the third material layer 24 contacting the second material layer 22 are opposite to 2DEG, and may be referred to as 2DHG. The 2DEG of the first material layer 20 may be used as an n channel, whereas the 2DHG of the third material layer 24 may be used as a p channel.

As shown in FIG. 3, when a positive voltage is applied to the first material layer 20 and a voltage for moving the 2DHG is applied to the third material layer 24, the 2DEG is partially removed from the first material layer 20, and the 2DHG is partially removed from the third material layer 24. Accordingly, a charge-neutral region A1 may be formed in the first, second and third material layers 20, 22 and 24. When the 2DEG and the 2DHG of the two material layers 20 and 24 are partially removed and the charge-neutral region A1 is formed, it is said that the charge-neutral region A1 is formed by dual depletion. In other words, a dual depletion region is formed. In the region A1, the net charge is zero. Therefore, if the region A1 (that is, the dual depletion region) exists between the gate and the drain of a HEMT, the high breakdown voltage characteristic of the HEMT improves, and thus the breakdown voltage of the HEMT may increase. Furthermore, concentration of an electric field at the gate may be prevented without an auxiliary element (e.g., a conventional field plate), and electric field distribution between the gate and the drain of the HEMT may be steadily maintained without a peak.

The effects described above are shown in FIG. 4.

Figure 4:
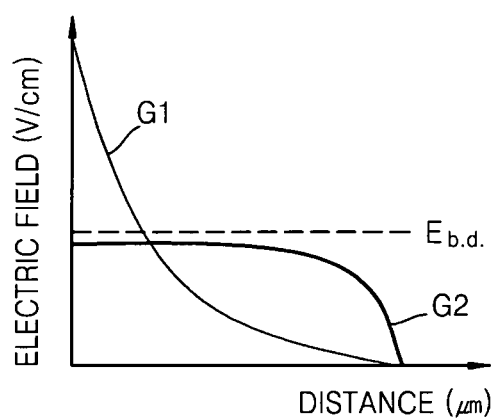
FIG. 4 is a graph showing electric field characteristics of a HEMT according to example embodiments and a HEMT in the related art to which dual depletion is not applied.

FIG. 4 shows electric field characteristics of a HEMT conceptually shown in FIG. 3 and a HEMT in the related art to which dual depletion is not applied.

In FIG. 4, the horizontal axis indicates distances measured from a gate, and the vertical axis indicates an electric field. In FIG. 4, a first graph G1 shows electric field characteristics of the HEMT in the related art. A second graph G2 shows electric field characteristics of the HEMT including the first, second and third material layers 20, 22 and 24 as shown in FIG. 3.

Referring to the first (G1) and second (G2) graphs of FIG. 4, the electric field in the HEMT of the related art exceeds breakdown electric field $E_{b,d}$ at points close to the gate as illustrated by the first graph G1.

However, in the case of the HEMT shown in FIG. 3, the electric field is below the breakdown electric field $E_{b,d}$ for all distances, and the distribution of the electric field with respect to the distances is steady. Therefore, the electric field is not concentrated at the gate even at points close to the gate.

Figure 5:
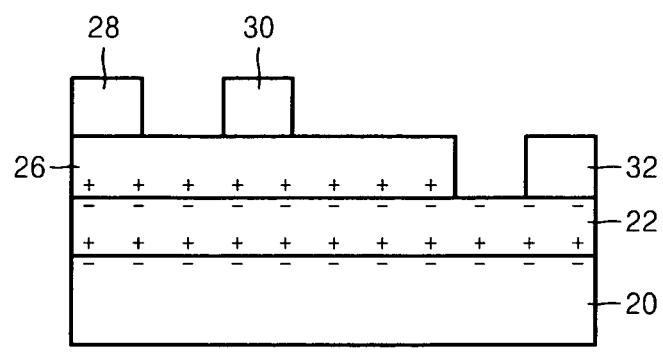
FIG. 5 is a cross-sectional view of a HEMT according to example embodiments.

FIG. 5 shows a HEMT according to example embodiments to which the basic concept described above with reference to FIGS. 1 through 3 is applied.

Referring to FIG. 5, the second material layer 22 is disposed on the first material layer 20. The first and second material layers 20 and 22 may be the material layers as described above with reference to FIGS. 1 through 3. The first material layer 20 may be formed on a substrate (not shown). Here, a buffer layer (not shown) may be further interposed between the substrate and the first material layer 20. The substrate may be, for example, a silicon substrate, a silicon carbide substrate or a sapphire substrate. A fourth material layer 26 is disposed on the second material layer 22. The fourth material layer 26 may be the same as the third material layer 24 described above with reference to FIGS. 2 and 3. Therefore, the fourth material layer 26 has 2DHG on the surface contacting the second material layer 22, and may function as a p channel.

The fourth material layer 26 is disposed only on a portion of the second material layer 22. A source electrode 28 and a gate electrode 30 are disposed apart from each other on the fourth material layer 26. A drain electrode 32 is disposed apart from the fourth material layer 26, and on the second material layer 22.

Figure 6:
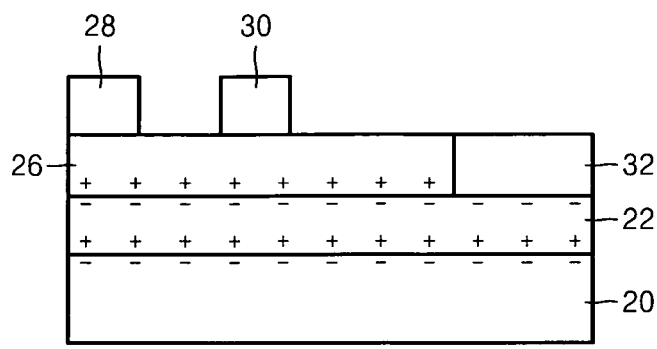
FIG. 6 is a cross-sectional view showing the case in which an upper material layer and a drain electrode contact each other in FIG. 5.

As shown in FIG. 6, the fourth material layer 26 and the drain electrode 32 may contact each other on the second material layer 22.

Referring back to FIG. 5, the source electrode 28 and the drain electrode 32 may be formed of a same material or different materials. For example, the source electrode 28 and the drain electrode 32 may be formed of titanium (Ti), aluminum (Al), tungsten (W), tungsten silicon (WSi), or the like. The source electrode 28 is in ohmic contact with the fourth material layer 26, and the drain electrode 32 is in ohmic contact with the second material layer 22. Therefore, the source electrode 28 and the drain electrode 32 may be formed of any material as long as the material is a conductive material capable of forming an ohmic contact with the second and fourth material layers 22 and 26. The gate electrode 30 forms a Schottky contact with the fourth material layer 26. For example, the gate electrode 30 may be formed of nickel (Ni) and/or platinum (Pt). Each of the gate electrode 30, the source electrode 28 and the drain electrode 32 may have a single layer, or multiple layers.

Figure 7:
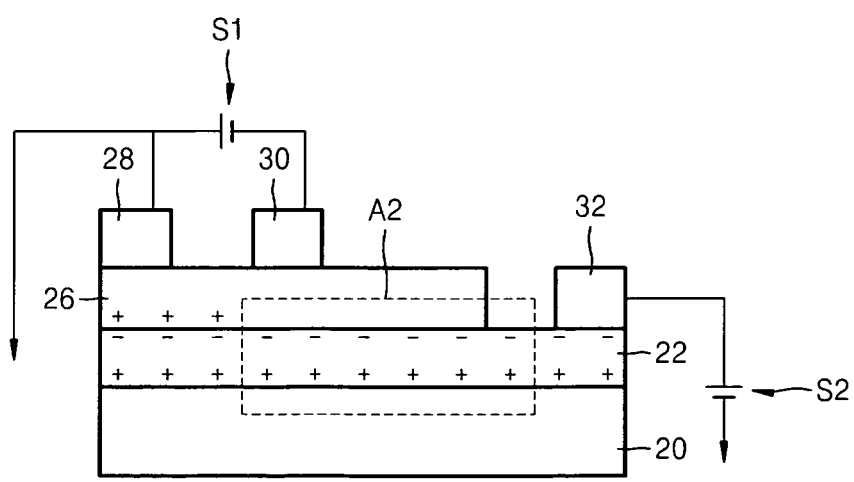
FIG. 7 shows a process of forming a dual depletion area in the HEMT of FIG. 5.

FIG. 7 shows a process of forming a dual depletion area in the HEMT of FIG. 5.

Referring to FIG. 7, a first power source S1 is connected to the source electrode 28 and the gate electrode 30, and a second power source S2 is connected to the drain electrode 32. As a result, the 2DEG between the gate electrode 30 and the drain electrode 32 of the first material layer 20 is removed via the drain electrode 32. Also, the 2DHG between the gate electrode 30 and the drain electrode 32 of the fourth material layer 26 is removed via the source electrode 28. Therefore, a dual depletion region A2 with zero net charge is formed in the space including the first, second and fourth material layers 20, 22 and 26 between the gate electrode 30 and the drain electrode 32.

Figure 8:
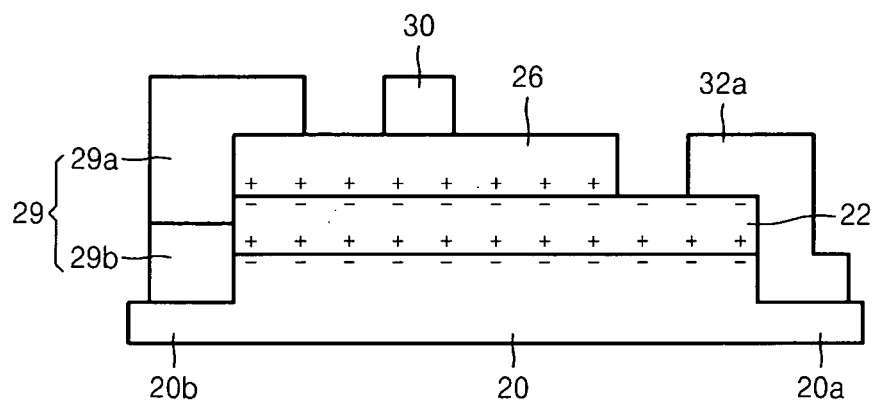
FIG. 8 is a diagram showing modified examples of a source electrode and a drain electrode of FIG. 5.

FIG. 8 is a diagram showing modified examples of the source electrode 28 and the drain electrode 32 of FIG. 5.

Referring to FIG. 8, the first material layer 20 includes first and second portions 20a and 20b extending in opposite lateral directions. A source electrode 29 includes first and second source electrodes 29a and 29b, respectively. The first source electrode 29a may be disposed on the second source electrode 29b. The first source electrode 29a contacts the top surface and a side surface of the fourth material layer 26, and contacts a portion of a side surface of the second material layer 22. The first source electrode 29a is in ohmic contact with the fourth material layer 26. The second source electrode 29b is formed on the second portion 20b extending from the first material layer 20, and contacts a portion of a side surface of the second material layer 22. The second source electrode 29b is in ohmic contact with the first material layer 20. The shapes of the first and second source electrodes 29a and 29b and the combined shape thereof are not limited to the shapes shown in FIG. 8. The first and second source electrodes 29a and 29b may be separate from each other. For example, the first source electrode 29a may be formed only on the top surface of the fourth material layer 26, whereas the second source electrode 29b may be formed only on the second portion 20b of the first material layer 20. A drain electrode 32a may contact a side surface of the second material layer 22 and may extend onto the first portion 20a of the first material layer 20.

In the case shown in FIG. 8, the fourth material layer 26 and the drain electrode 32a may contact each other.

Figure 9:
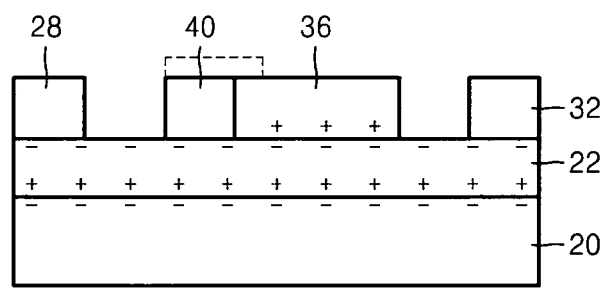
FIG. 9 is a diagram showing a HEMT according to example embodiments.

FIG. 9 is a diagram showing a HEMT according to example embodiments, to which the embodiments described above with reference to FIGS. 1 through 3 are applied. Hereinafter, repeated descriptions will be omitted, and like reference numerals refer to like elements throughout.

Referring to FIG. 9, the source electrode 28, the drain electrode 32, a gate electrode 40 and a fifth material layer 36 are disposed on the second material layer 22. An insulation layer (not shown) may be placed between the fifth material layer 36 and the gate electrode 40. The fifth material layer 36 may have the same function and may be formed of the same material as the fourth material layer 26 described above. The drain electrode 32 is disposed apart from the source electrode 28, the gate electrode 40 and the fifth material layer 36. The source electrode 28 and the gate electrode 40 are disposed apart from each other. A side surface of the gate electrode 40 contacts the fifth material layer 36. The side surface of the gate electrode 40 is in ohmic contact with the fifth material layer 36. The bottom surface of the gate electrode 40 forms a Schottky contact with the second material layer 22. Therefore, the 2DHG of the fifth material layer 36 may be removed via the gate electrode 40.

Meanwhile, as indicated with a dotted line in FIG. 9, the gate electrode 40 may extend onto the top surface of the fifth material layer 36.

Figure 10:
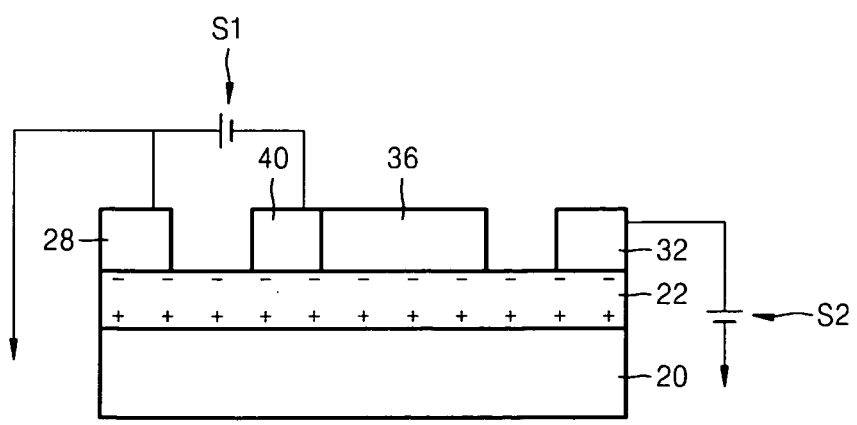
FIG. 10 shows a first power source and a second power source being applied to a source electrode, a drain electrode, and a gate electrode of the HEMT of FIG. 9.

FIG. 10 shows that the first power source S1 and second power source S2 are applied to the source electrode 28, the drain electrode 32 and the gate electrode 40 of the HEMT of FIG. 9. As described above, a dual depletion region is formed in the space between the gate electrode 40 and the drain electrode 32 due to the application of the first power source S1 and second power source S2.

Figure 11:
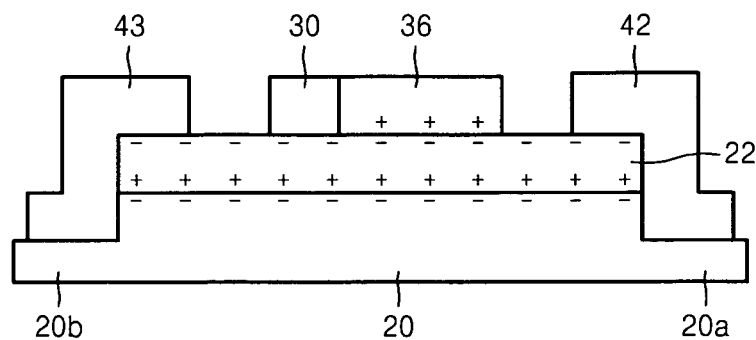
FIG. 11 is a diagram showing modified examples of the source electrode and the drain electrode of the HEMT of FIG. 9.

FIG. 11 is a diagram showing modified examples of the source electrode 28 and the drain electrode 32 of the HEMT of FIG. 9.

Referring to FIG. 11, the first material layer 20 includes first and second portions 20a and 20b extending in opposite lateral directions. The source electrode 28 and the drain electrode 32 of FIG. 9 may be modified to have the same shapes as or similar shapes to the source electrode 29 and the drain electrode 32a of FIG. 8, as shown in FIG. 11. Alternatively, only one of the source electrode and the drain electrode of FIGS. 8 and 11 may be modified. A drain electrode 42 extends from the top surface of the second material layer 22, contacts a side surface of the second material layer 22, and extends onto the first portion 20a of the first material layer 20. The drain electrode 42 may have the same shape as the drain electrode 32a of FIG. 8. A source electrode 43 extends from the top surface of the second material layer 22, contacts another side surface of the second material layer 22, and extends onto the second portion 20b of the first material layer 20.

In the case shown in FIG. 11, the drain electrode 42 may contact the fifth material layer 36.

Figure 12:
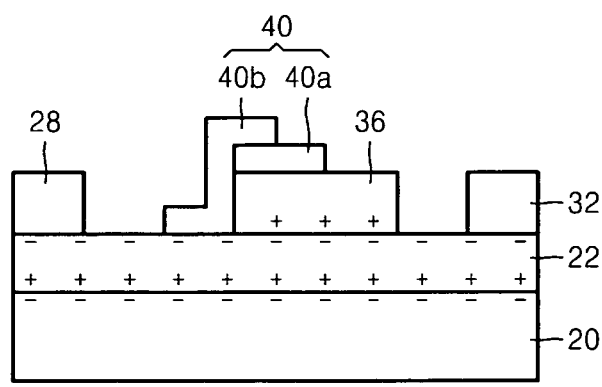
FIG. 12 is a diagram showing a modified example of a gate electrode of FIG. 9.

FIG. 12 is a diagram showing a modified example of the gate electrode of FIG. 9.

Referring to FIG. 12, the gate electrode 40 includes a first gate electrode 40a and a second gate electrode 40b. The first gate electrode 40a may be disposed on the top surface of the fifth material layer 36. The second gate electrode 40b may extend from the top surface of the first gate electrode 40a, and contact a side surface of the first gate electrode 40a and a side surface of the fifth material layer 36. The second gate electrode 40b may further extend down to the top surface of the second material layer 22 without contacting the source electrode 28. In this modified example, the first gate electrode 40a is in ohmic contact with the fifth material layer 36. On the contrary, the second gate electrode 40b forms Schottky contacts with the second material layer 22 and the fifth material layer 36. As a result, the first and second gate electrodes 40a and 40b may have the same function as the gate electrode 40 of FIG. 9.

The source electrode 28 and the drain electrode 32 of FIG. 12 may be modified to the source electrode 43 and the drain electrode 42 of FIG. 11, respectively.

Figure 13:
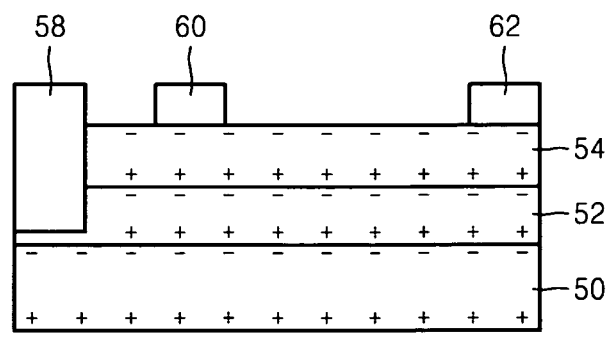
FIG. 13 is a diagram showing a HEMT according to example embodiments.

FIG. 13 is a diagram showing a HEMT according to example embodiments to which the embodiments described above with reference to FIGS. 1 through 3 are applied.

Referring to FIG. 13, sixth, seventh and eighth material layers 50, 52, and 54 are sequentially stacked. The sixth and eighth material layers 50 and 54 may be the same as the second material layer 22 described above. That is, the sixth material layer 50 and the eighth material layer 54 have polarizations therein, and may be compound semiconductor layers of which the main materials belong to the groups III-V (e.g., AlGaN layers). The seventh material layer 52 may be the same as the first material layer 20 described above. In other words, the seventh material layer 52 may be a compound semiconductor layer of which the main materials belong to the groups III-V (e.g., a GaN layer or an InGaN layer). Therefore, a 2DHG channel (that is, a p channel) is formed on the surface of the seventh material layer 52 contacting the sixth material layer 50. A 2DEG channel (that is, an n channel) is formed on the surface of the seventh material layer 52 contacting the eighth material layer 54. A gate electrode 60 and a drain electrode 62 are disposed apart from each other on the eighth material layer 54.

The gate electrode 60 forms a Schottky contact with the eighth material layer 54. The drain electrode 62 is in ohmic contact with the eighth material layer 54. A source electrode 58 is disposed on the 2DHG channel of the seventh material layer 52, and may directly contact the 2DHG channel. The source electrode 58 also contacts the 2DEG channel of the seventh material layer 52 and a side surface of the eighth material layer 54. The source electrode 58 protrudes higher than the top surface of the eighth material layer 54. The source electrode 58 is in ohmic contact with the seventh material layer 52. Alternatively, the drain electrode 62 may be disposed to directly contact the 2DEG channel of the seventh material layer 52. In this case, the eighth material layer 54 may be disposed on only a portion of the seventh material layer 52.

Figure 14:
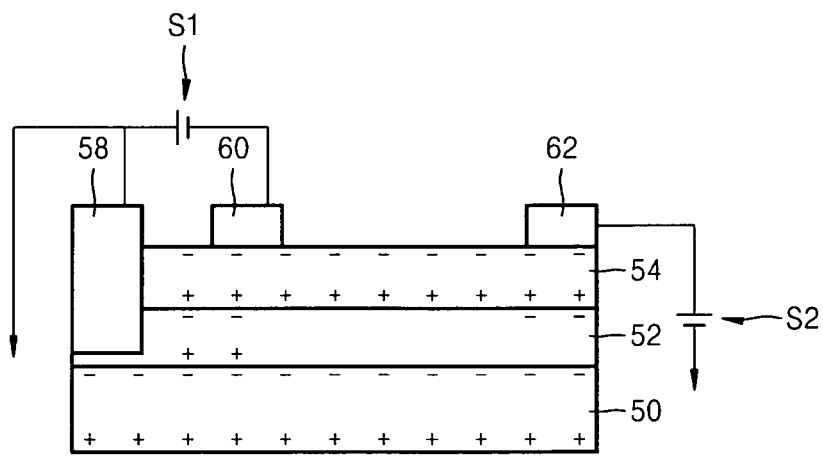
FIG. 14 is a cross-sectional view showing the case in which power is applied to a source electrode, a drain electrode, and a gate electrodes of the HEMT of FIG. 13.

As shown in FIG. 14, when the first power source S1 is applied to the source electrode 58 and the gate electrode 60 and the second power source S2 is applied to the drain electrode 62, the 2DEG and 2DHG are respectively removed via the drain electrode 62 and the source electrode 58 in the seventh material layer 52 between the gate electrode 60 and the drain electrode 62. As a result, a dual depletion region is formed in the space between the gate electrode 60 and the drain electrode 62.

Figure 15:
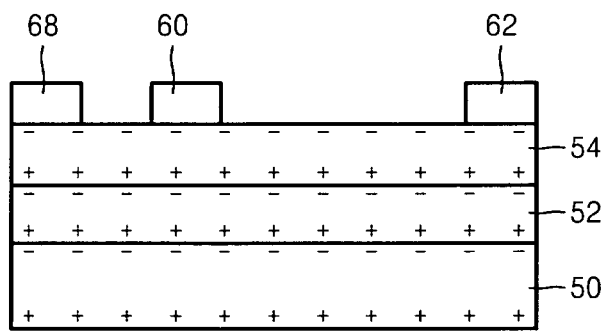
FIG. 15 is a cross-sectional view showing the case in which the source electrode, the drain electrode, and the gate electrodes are formed on a same material layer.

Meanwhile, the source electrode 58 of FIG. 13 may be disposed on the eighth material layer 54 in a similar manner as a source electrode 68 of FIG. 15.

Next, a method of manufacturing a HEMT according to example embodiments will be described with reference to FIGS. 16 through 29. In FIGS. 16 through 29, charges are not shown. Furthermore, descriptions on the elements that are already described above will be omitted.

First, a method of manufacturing a HEMT according to example embodiments will be described below with reference to FIGS. 16 through 19.

Figure 16:
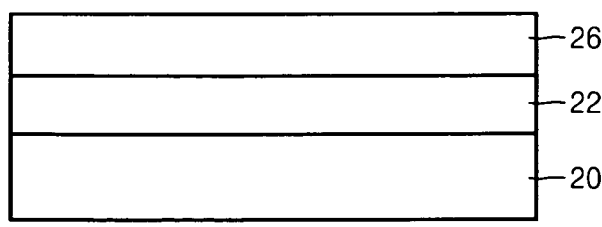
FIGS. 16 through 29 illustrate a method of manufacturing a HEMT according to example embodiments.

Referring to FIG. 16, the second material layer 22 and the fourth material layer 26 are sequentially stacked on the first material layer 20.

Figure 17:
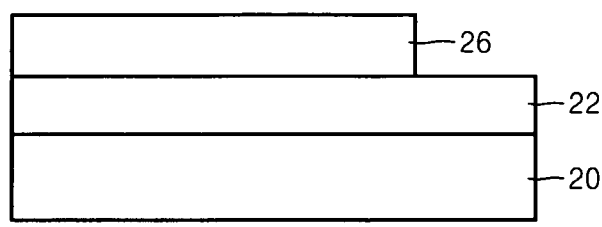
Figure 18:
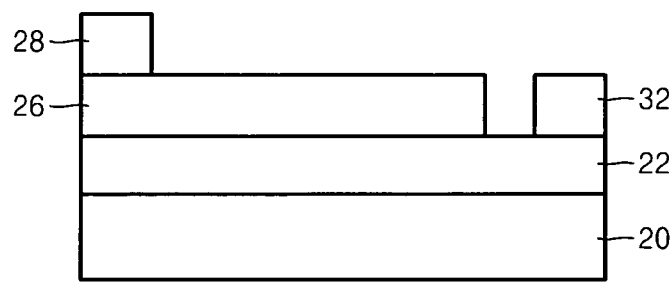

Referring to FIG. 17, the second material layer 22 is partially exposed by partially etching the fourth material layer 26. As shown in FIG. 18, the drain electrode 32 is formed on the exposed portion of the second material layer 22 and the source electrode 28 is formed on the fourth material layer 26 by using a general photolithography method. Since the source electrode 28 and the gate electrode 30 are formed on the same surface of the fourth material layer 24, the location of the source electrode 28 is defined based on the location of the gate electrode 30 which is formed in the following procedure. After the source electrode 28 and the drain electrode 32 are formed, a thermal process, for example, may be performed thereon to establish an ohmic contact.

Figure 19:
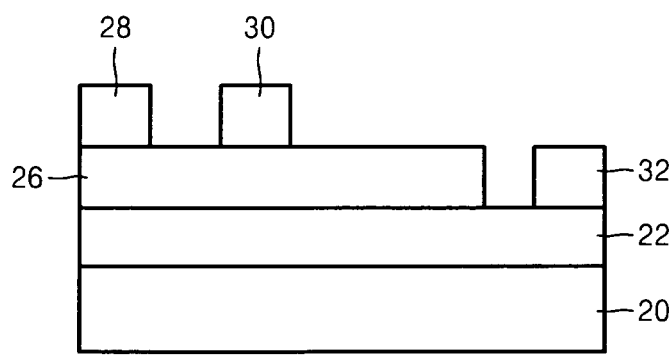

Referring to FIG. 19, the gate electrode 30 is formed on the fourth material layer 26. The gate electrode 30 is formed to be apart from the source electrode 28.

Next, a method of manufacturing a HEMT according to other example embodiments will be described with reference to FIGS. 20 through 24.

Figure 20:
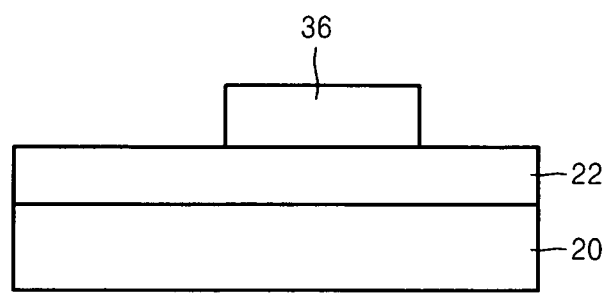
Figure 21:
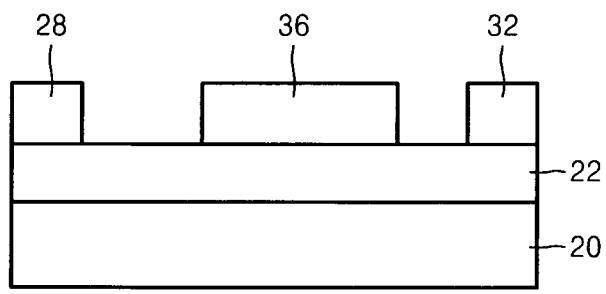

Referring to FIG. 20, the fifth material layer 36 is formed on a portion of the second material layer 22. As shown in FIG. 21, the source electrode 28 and the drain electrode 32 are formed on the second material layer 22. The source electrode 28 and the drain electrode 32 may be formed to face each other across the fifth material layer 36. The source electrode 28, the drain electrode 32 and the fifth material layer 36 are formed to be apart from each other.

Figure 22:
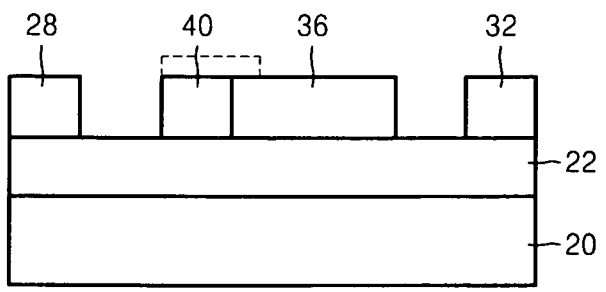

Referring to FIG. 22, the gate electrode 40 is formed on the second material layer 22. The gate electrode 40 is formed to contact the fifth material layer 36. Here, the gate electrode 40 is formed such that a side surface of the gate electrode 40 is in ohmic contact with a side surface of the fifth material layer 36. Furthermore, the gate electrode 40 is formed such that the bottom surface of the gate electrode 40 forms a Schottky contact with the second material layer 22.

The gate electrode 40 is formed to be apart from the source electrode 28 and the drain electrode 32. As indicated with a dotted line, the gate electrode 40 may be formed to extend onto the top surface of the fifth material layer 36.

Figure 23:
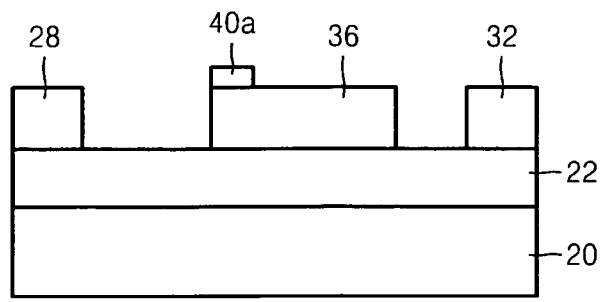
Figure 24:
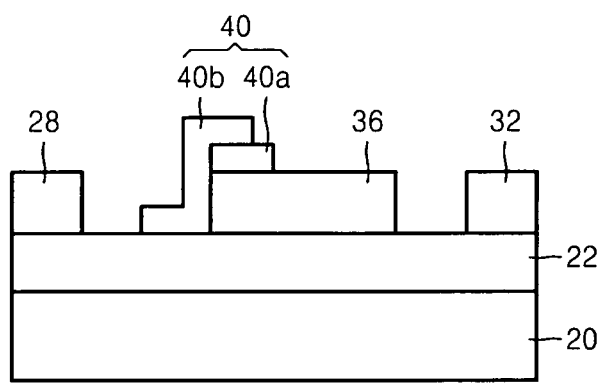

Alternatively, the gate electrode 40 may be formed in two portions. For example, as shown in FIG. 23, the first gate electrode 40a is formed on the top surface of the fifth material layer 36. Here, the first gate electrode 40a may be formed to be in ohmic contact with the fifth material layer 36. As shown in FIG. 24, the second gate electrode 40b is formed. The second gate electrode 40b may be formed to extend from the top surface of the first gate electrode 40a, contact a side surface of the first gate electrode 40a and a side surface of the fifth material layer 36, and extend onto the second material layer 22. Here, the second gate electrode 40b is formed to form a Schottky contact with the second material layer 22.

Next, a method of manufacturing a HEMT according to yet other example embodiments will be described with reference to FIGS. 25 through 29.

Figure 25:
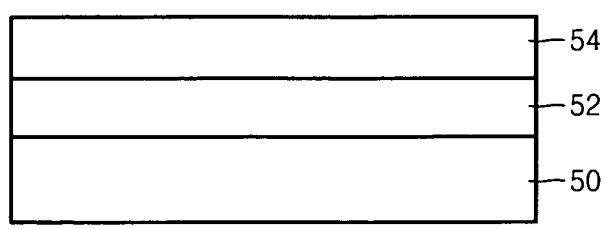
Figure 26:
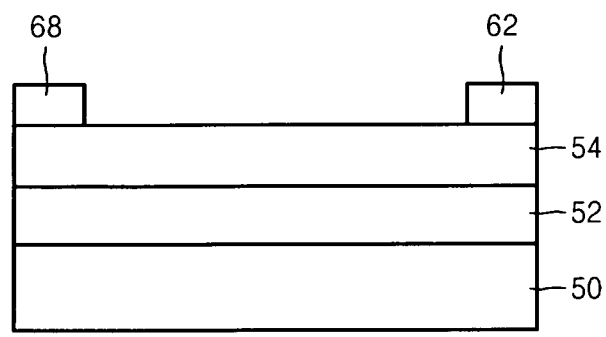

Referring to FIG. 25, the seventh material layer 52 and the eighth material layer 54 are sequentially stacked on the sixth material layer 50. As shown in FIG. 26, the source electrode 68 and the drain electrode 62 are formed on the eighth material layer 54. The source electrode 68 and the drain electrode 62 are formed to be apart from each other.

Figure 27:
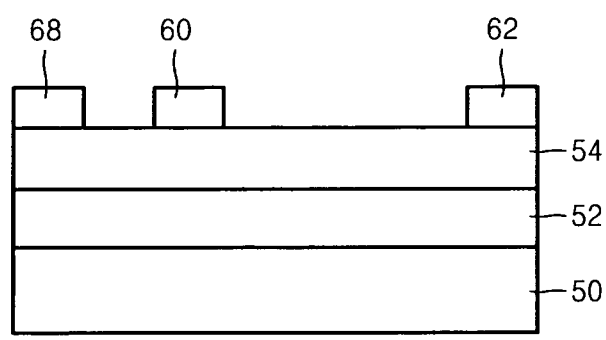

As shown in FIG. 27, the gate electrode 60 is formed on the eighth material layer 54. The gate electrode 60 is formed between the source electrode 68 and the drain electrode 62, and is formed to be apart from the source electrode 68 and the drain electrode 62.

Figure 28:
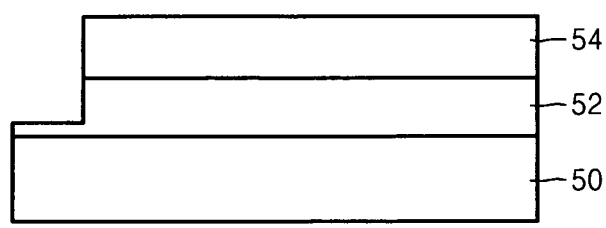
Figure 29:
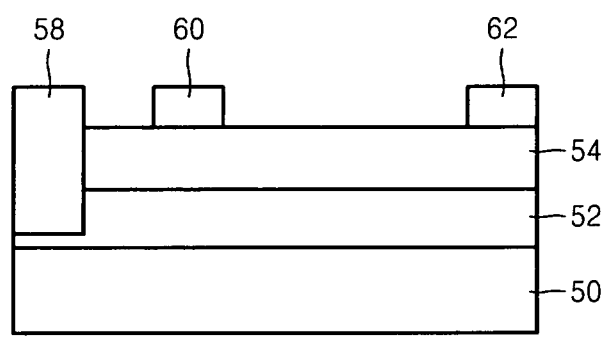

The source electrode 68 may be formed elsewhere. For example, as shown in FIG. 28, after the eighth material layer 54 is formed, the seventh material layer 52 is partially exposed by etching a portion of the eighth material layer 54. As shown in FIG. 29, the source electrode 58 is formed on the portion of the seventh material layer 52 exposed by the etching. Here, the source electrode 58 contacts a side surface of the seventh material layer 52 exposed by the etching and contacts a side surface of the eighth material layer 54 exposed by the etching. The source electrode 58 is formed to protrude higher than the top surface of the eighth material layer 54. The source electrode 58 may also be formed to extend onto the top surface of the eighth material layer 54 without contacting the gate electrode 60.

Meanwhile, in the descriptions above, the first material layer 20 and the sixth material layer 50 may be referred to as lower material layers. The second material layer 22 and the seventh material layer 52 may be referred to as intermediate layers, or intermediate material layers. The third material layer 24, the fourth material layer 26, the fifth material layer 36 and the eighth material layer 54 may be referred to as upper material layers.

The above described example embodiments related to the cases in which AlGaN and GaN are grown in the Ga-face direction. In the example embodiments shown in FIGS. 1 through 3 and FIGS. 5 through 12, an intermediate layer is formed of AlGaN with a relatively (or substantially) high polarizability (or polarity). Thus, a 2DEG is formed on the surface of a lower material layer contacting the intermediate layer. In the example embodiments shown in FIGS. 13 through 15, an intermediate layer is formed of GaN with a relatively (or substantially) low polarizability (or polarity). Thus, a 2DEG is formed on the surface of the intermediate layer contacting an upper material layer.

When AlGaN with a relatively high polarizability (or polarity) is grown on GaN of the Ga-face, positive surface charges appear on the GaN/AlGaN interface due to a difference of polarizabilities (or polarities) of GaN and AlGaN, and the band gap is bent by the charges. As a result, the 2DEG is formed on a surface (interface) of GaN with a relatively (or substantially) low polarizability (or polarity) wherein the surface is in contact with AlGaN, and thus space charges are offset.

On the contrary, in the case where GaN is grown on AlGaN, a sign of surface charges due to polarization is reversed, and thus a 2DHG is formed on the surface (interface) of GaN contacting AlGaN.

In the case where AlGaN and GaN are grown in the N-face direction, the direction of charges is changed. Therefore, in the case where an intermediate layer is formed of AlGaN with a relatively high polarizability (or polarity), a 2DEG is formed on a surface (interface) of an upper material layer contacting AlGaN. In the case where an intermediate layer is formed of GaN with a relatively (or substantially) low polarizability (or polarity), a 2DHG is formed on a surface (interface) of the intermediate layer contacting a lower material layer. For the upper material layer, the intermediate layer and the lower material layer, each layer is not limited to a single material layer and each layer may be made of multi-material layers. Furthermore, compositions thereof may be changed gradually.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A high electron mobility transistor (HEMT), comprising:
   an intermediate material layer on a lower material layer;
   an upper material layer and a drain electrode over the intermediate material layer,
      the upper material layer being only on a portion of a top surface of the intermediate material layer,
      the upper material layer having a narrower width than a width of the intermediate material layer,
      the drain electrode being in direct contact with the intermediate material layer but not in direct contact with the upper material layer;
   one gate electrode and a source electrode on the upper material layer, the one gate electrode and the source electrode being in direct contact with a top surface of the upper material layer that is a same surface of the upper material layer;
   a first power source connected to the source electrode and the one gate electrode, the first power source including a first terminal electrically connected to the source electrode and a second terminal electrically connected to the one gate electrode, the first terminal having a polarity that is different than a polarity of the second terminal; and a second power source electrically connected to the drain electrode but not the source electrode and the one gate electrode, the second power source including a first polarity-type terminal connected to the drain electrode and a second polarity-type terminal, a polarity of the first polarity-type terminal of the second power source being different than a polarity of the second terminal of the first power source, wherein a polarity of the intermediate material layer is different from polarities of the upper material layer and the lower material layer.

2. The HEMT of claim 1, wherein the upper material layer and the drain electrode are spaced apart from each other on the intermediate material layer.

3. The HEMT of claim 1, wherein the second power source is not electrically connected to the source electrode, the second power source is not electrically connected to the one gate electrode, and the first and second power sources are configured to reduce an electric field concentration adjacent to the one gate electrode by forming a dual depletion region in the upper material layer, intermediate material layer, and lower material layer between the one gate electrode and the drain electrode.

\* \* \* \* \*